(12) United States Patent
Karasik et al.

(10) Patent No.: US 9,564,698 B2
(45) Date of Patent: Feb. 7, 2017

(54) CAPACITOR FRAME ASSEMBLY

(71) Applicant: Autoliv ASP, Inc., Ogden, UT (US)

(72) Inventors: Boris G. Karasik, Commerce Township, MI (US); William M. Leach, West Bloomfield, MI (US)

(73) Assignee: AUTOLIV ASP, INC., Ogden, UT (US)

(*) Notice: Subject to any disclaimer, the term of this patent is extended or adjusted under 35 U.S.C. 154(b) by 74 days.

(21) Appl. No.: 14/714,916

(22) Filed: May 18, 2015

(65) Prior Publication Data

US 2016/0344119 A1 Nov. 24, 2016

(51) Int. Cl.
*H05K 7/12* (2006.01)
*H01R 12/70* (2011.01)
*H05K 1/18* (2006.01)

(52) U.S. Cl.
CPC ............ *H01R 12/7076* (2013.01); *H05K 1/18* (2013.01)

(58) Field of Classification Search
CPC .. H05K 5/0056; H05K 5/0069; H01R 12/7064
USPC ...................... 174/138 G; 439/76.1
See application file for complete search history.

(56) References Cited

U.S. PATENT DOCUMENTS

| | | | | |
|---|---|---|---|---|
| 6,265,840 B1* | 7/2001 | Wiezorek | ............ | B60R 16/0239 318/434 |
| 6,459,042 B1 | 10/2002 | Stilianos et al. | | |
| 6,572,412 B2 | 6/2003 | Beuther et al. | | |
| 2002/0106939 A1* | 8/2002 | Beuther | ............... | H05K 5/0069 439/620.23 |
| 2003/0199195 A1* | 10/2003 | Koehler | ............... | H01R 12/724 439/541.5 |
| 2008/0025006 A1* | 1/2008 | Kawabata | ........... | H01M 2/1055 361/752 |

* cited by examiner

*Primary Examiner* — Steven T Sawyer
(74) *Attorney, Agent, or Firm* — Brinks Gilson & Lione

(57) ABSTRACT

An assembly provides a dual function for mounting a port connector on a circuit board and also secures a capacitor to the circuit board. The assembly includes the circuit board and a monolithic plastic frame having a flange, a snap structure, a capacitor cradle, and a socket section. The flange has a fastening structure for fastening the frame to the circuit board. The snap structure for a snap-in attachment of the port connector to the frame is arranged near an end edge of the circuit board. The capacitor cradle for holding a cylindrical capacitor is formed adjacent to the snap structure and is elevated from the circuit board by an air gap. The socket section bears socket contacts for receiving capacitor contact leads.

14 Claims, 5 Drawing Sheets

CAPACITOR FRAME ASSEMBLY

TECHNICAL FIELD OF THE INVENTION

The present invention relates to an assembly for mounting a port connector and a capacitor on a circuit board.

BACKGROUND

In automotive vehicles safety, comfort, and entertainment functions are increasingly performed by electronics. While the vehicle is moving, these electronics are subjected to shock and vibration that may wear on circuit boards, electronic components, and electric contacts. Furthermore, as vehicle specifications call for ever increasing numbers of mandatory and optional features, all vehicle components, including electronic components, need to meet strict packaging and weight constraints.

Many electrical circuit boards have a port connector that connects the circuit board to other electrical components located off the circuit board. An electrolytic capacitor is often incorporated on the circuit board. The electrolytic capacitor may in some cases be relatively large and heavy, particularly when used as a reserve energy storage component. Shocks and vibrations acting on such large-sized capacitors may cause damage to the capacitor or to the circuit board, on which it is mounted. Also, the electrolytic capacitor claims considerable space on the circuit board.

It is therefore desirable to provide electronic assemblies that withstand shock and vibration on the one hand and that have a small size and low weight on the other hand.

SUMMARY OF THE INVENTION

According to one aspect of the present invention, an assembly provides a dual function for mounting a port connector on a circuit board and also secures a capacitor to the circuit board. The assembly includes the circuit board and a monolithic plastic frame having a flange, a snap structure, a capacitor cradle, and a socket section. The flange has a fastening structure for fastening the frame to the circuit board. The snap structure for a snap-in attachment of the port connector to the frame is arranged near an end edge of the circuit board. The capacitor cradle for holding a cylindrical capacitor is formed adjacent to the snap structure. The socket section bears socket contacts for receiving capacitor contact leads.

For saving space on the circuit board and for mechanically decoupling the capacitor from the circuit board, the capacitor cradle may be elevated from the circuit board plane, defining an air gap between the capacitor cradle and the circuit board.

The capacitor cradle may be formed on a crossbar extending parallel to the end edge. In particular, the capacitor cradle may be shaped to hold the cylindrical capacitor in a direction, in which the cylindrical axis extends parallel to the end edge of the circuit board. This provides a space-saving arrangement because the capacitor does not protrude far into the area of the circuit board.

The snap structure may be formed on the crossbar extending parallel to the end edge between the capacitor cradle and the flange, giving the crossbar a dual function.

The socket contacts may be external socket contacts. For example, the external socket contacts may include slotted tongues for easy insertion of the capacitor contact leads. Alternatively, the socket contacts are disposed inside socket channels for receiving the capacitor contact leads to provide an internal contact protected from external influences.

The flange may include two flange arms adjacent opposite lateral edges of the circuit board, thereby providing the maximum available space between the flange arms.

For easy mounting of the port connector on the frame, each of the flange arms may have a guide structure for positioning the port connector.

Further details and advantages will become apparent from the following description of preferred embodiments shown in the accompanying drawings. The drawings are provided purely for illustrative purposes and are not intended to limit the scope of the present invention.

DETAILED DESCRIPTION OF THE DRAWINGS

Figure 1:
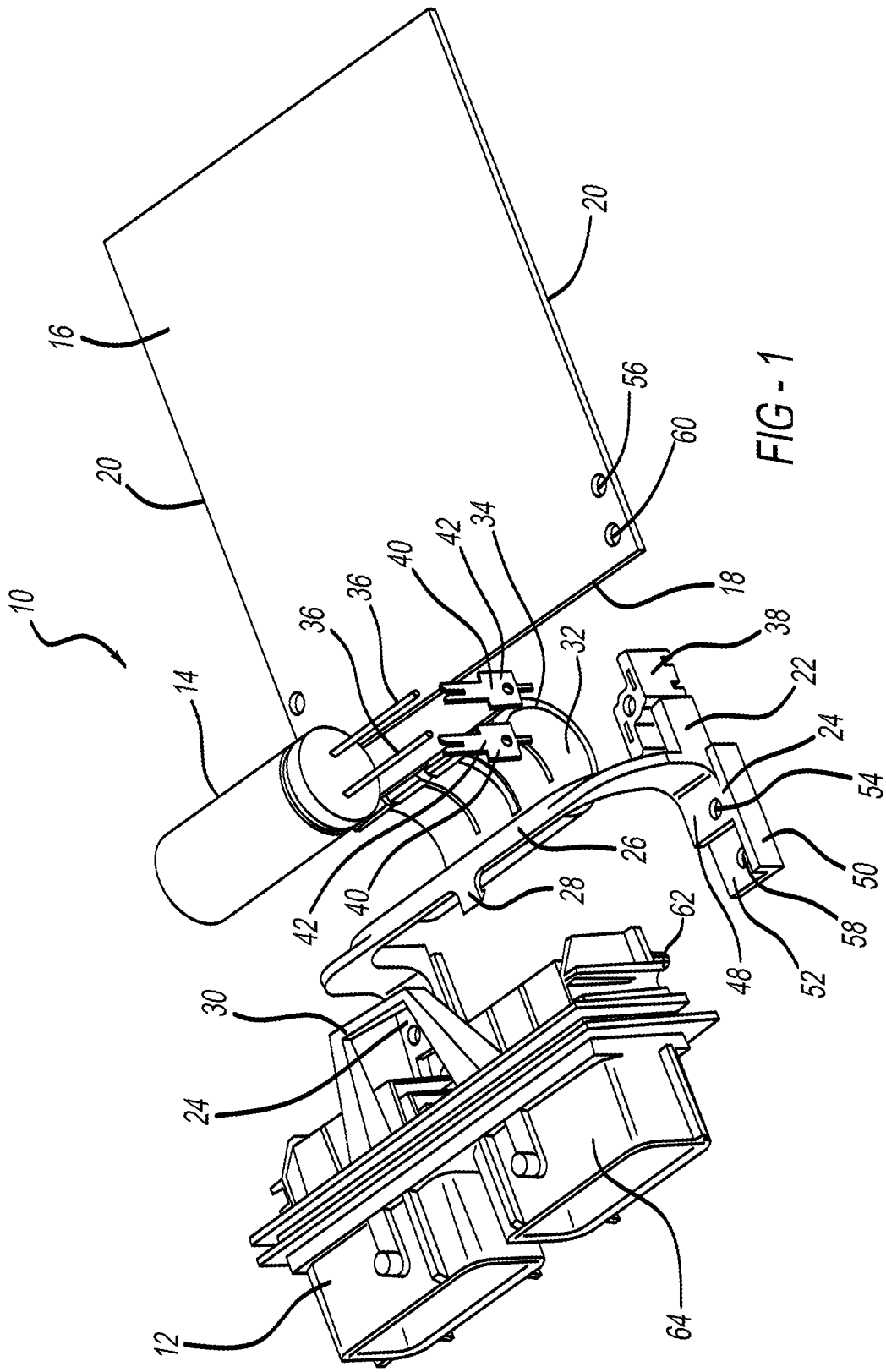
FIG. 1 shows an exploded view of a first embodiment of an assembly including a circuit board and a plastic frame.
Figure 2:
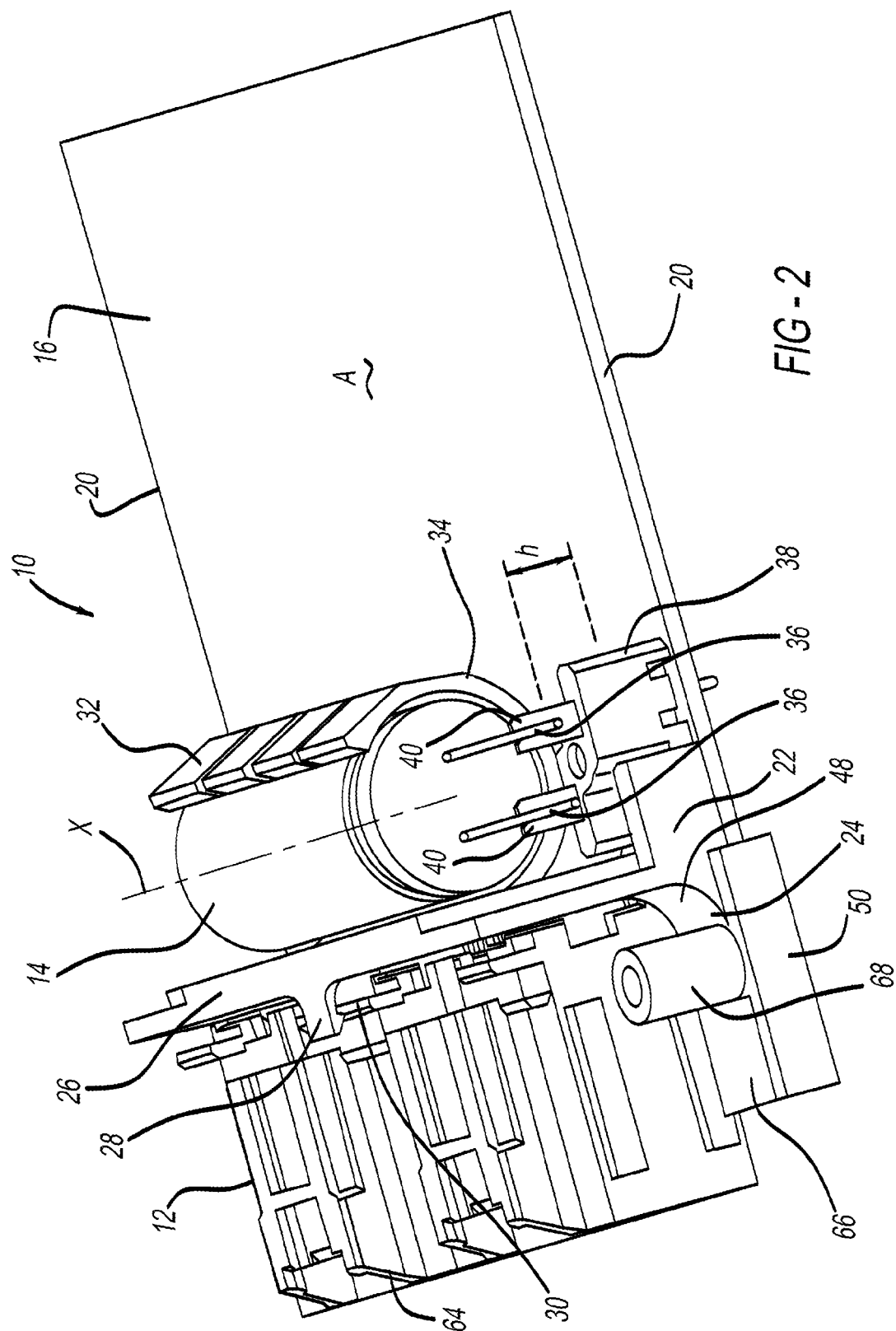
FIG. 2 shows the assembly of FIG. 1 in a first perspective view.

In FIGS. 1 and 2, an assembly 10 for mounting a port connector 12 and an electrolytic capacitor 14 on a circuit board 16. FIG. 1 shows the assembly 10 in an exploded view, and FIG. 2 shows a similar assembly 10 in an assembled state of the individual components of FIG. 1. FIG. 2 shows a differently shaped port connector 12, but as will be described below, the invention is not limited to a specific shape of the port connector 12.

The assembly 10 includes the circuit board 16 that defines a circuit board plane A coextending with the circuit board surface that faces upward in FIGS. 1 and 2. The circuit board 16 has a rectangular shape with a pair of relatively shorter sides and a pair of relatively longer sides. The shorter side shown on the left in FIG. 1 will be referred to as the end edge 18, and the two longer side adjacent to the end edge 18 will be referred to as lateral edges 20. It is, however within the scope of the present invention to select one of the longer sides as the end edge 18.

A monolithic plastic frame 22 has a flange arrangement that is shown as two lateral flange arms 24 adjacent the opposite lateral edges 20 of the circuit board 16. The flange arrangement has a fastening structure for mounting the frame 22 on the circuit board 16, which will be described in greater detail below.

Straddling the lateral width between the flange arms 24 is an elevated crossbar 26. On one side of the crossbar 26, a snap structure 28 is formed on the crossbar 26 for a snap-in attachment of the port connector 12 to the frame 22 near the left end edge 18 of the circuit board 16. The snap structure 28 engages a snap counterstructure 30 on the port connector 12. While the snap structure 28 is shown as a hook and the counterstructure as a bar, the arrangement may be reversed to place a hook or male part on the port connector 12 that engages a female structure on the crossbar 26 or that engages the crossbar 26 itself.

On the other side of the crossbar 26, opposite the snap structure 28, a capacitor cradle 32 for holding the cylindrical electrolytic capacitor 14 is formed on the crossbar 26. The capacitor cradle 32 is formed as an elastic clip in the shape of a partial cylinder jacket enveloping the cylindrical shape of the capacitor 14 over an angular range of more than 180 degrees and preferably less than 270 degrees. The cylindrical axis X of the capacitor 14 and of the capacitor cradle 32 extends parallel to the crossbar 26, thus parallel to the end edge 18 of the circuit board 16. The capacitor cradle 32 has at least one open axial end 34 for allowing capacitor contact leads 36 to extend axially out of the capacitor cradle 32. The capacitor cradle 32 is elevated from the circuit board plane A so that an air gap h is created between the capacitor cradle 32 and the circuit board 16. The air gap h ensures that, during shock and vibration acting on the assembly 10, the capacitor cradle 32 does not contact the circuit board plane A, even when bearing the weight of the capacitor 14 held in the capacitor cradle 32.

The frame 22 also includes a socket section 38 formed on the frame 22 with socket contacts 40 positioned in the socket section 38 for receiving the capacitor contact leads 36. The socket section 38 is located axially offset from the capacitor cradle 32, toward one of the lateral edges 20, near the open side of the capacitor cradle 32.

In the first embodiment as shown in FIG. 1, the socket contacts 40 are external socket contacts 40 in the sense that the ends of the capacitor contact leads 36 remain outside the socket section 38. The socket contacts 40 are shaped like slotted tongues 42. For mounting the socket contacts 40 in the socket section 38, they are inserted from below through slots formed in the socket section 38 so that the slotted portion of the socket contacts 40 protrude upward from the socket section 38. The slots in the socket section 38 are shown as axially offset from one another with respect to the cylindrical axis X of the capacitor 14. This arrangement allows for a greater width of the tongues 42 than if the socket contacts 40 were arranged at the same axial distance from the capacitor cradle 32.

Figure 5:
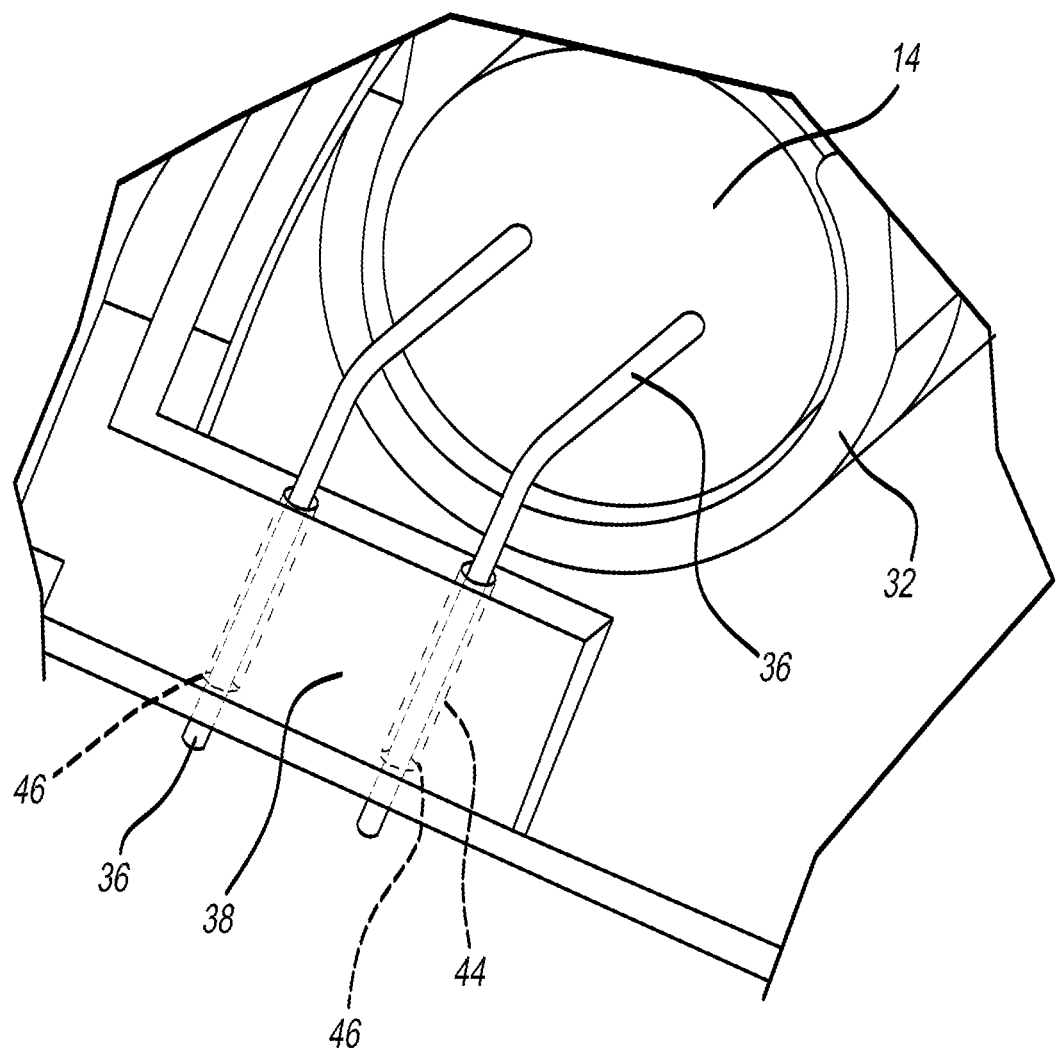
FIG. 5 shows a detail perspective view of a second embodiment of the assembly with a different arrangement of socket contacts.

In an alternative embodiment as shown in FIG. 5, the socket contacts 40 may be internal contacts. In FIG. 5, the socket section 38 includes contact channels 44 extending from the top to the bottom through the entire socket section 38. The circuit board 16 has holes 46 lining up with the contact channels 44. The socket contacts 40 are arranged inside the contact channels 44 and make contact with the capacitor contact leads 36 that are threaded through the contact channels 44 and through the matching holes 46 in the circuit board 16. In this embodiment, the capacitor contact leads 36 are first threaded through the contact channels 44 and are then bent when the capacitor 14 is placed in the capacitor cradle 32. This embodiment provides for better protection of the socket contacts 40 against mechanical impact.

Each of the two flange arms 24 includes a top portion 48 placed on top on the circuit board 16. Laterally adjacent each top portion 48 is lateral flange rail 50 extending outside the lateral edges 20 of the circuit board 16 for laterally positioning the circuit board 16 between the flange rails 50. Adjoining each flange rail 50 is a flange plate 52 extending underneath the circuit board 16 so that each of the flange arms 24 embraces one of the lateral edges 20 of the circuit board 16. In the shown example, the flange plate 52 of each of the flange arms 24 extends closer toward the end edge 18 than the top portion 48. The flange plates 52 secure the circuit board 16 in a predetermined vertical position.

In the shown example, the fastening structure includes fastening holes 54 that line up with mounting holes 56 extending through the circuit board 16. The fastening holes 54 extend through the top portion 48 and through the flange plate 52, above and below the mounting holes 56 in the circuit board 16. During assembly, the circuit board 16 is inserted into the flange arms 24 by a sliding movement.

For providing a guide structure for the port connector 12, both the circuit board 16 and the flange plates 52 include a guide structure in the form of guide holes 58 and 60 for guide pins 62 arranged on the underside of the port connector 12. The guide pins 62 extend vertically downward and match up with the guide holes 60 in the circuit board 16 and the guide holes 58 in the flange plates 52. For assembly, the guide pins 62 are inserted on both lateral sides vertically into the guide holes 58 and 60, and then the snap counterstructure 30 is snapped into the snap structure 28 of the crossbar 26.

The port connector 12 includes customary, preferably female, electronic connectors 64 for connecting the electronic elements (not shown) on the circuit board 16 to other electronic devices outside the circuit board 16. The shape of the port connector 12 is determined by the individual requirements of compatibility and space. Also, a housing may be placed over the port connector 12 and the circuit board 16. The snap counterstructure 30 and the guide elements of the port connector 12, here shown as the guide pins 62, may have different shapes than shown, just as the guide structure and snap structure 28 on the frame 22 may be modified to mate with such different shapes.

Figure 3:
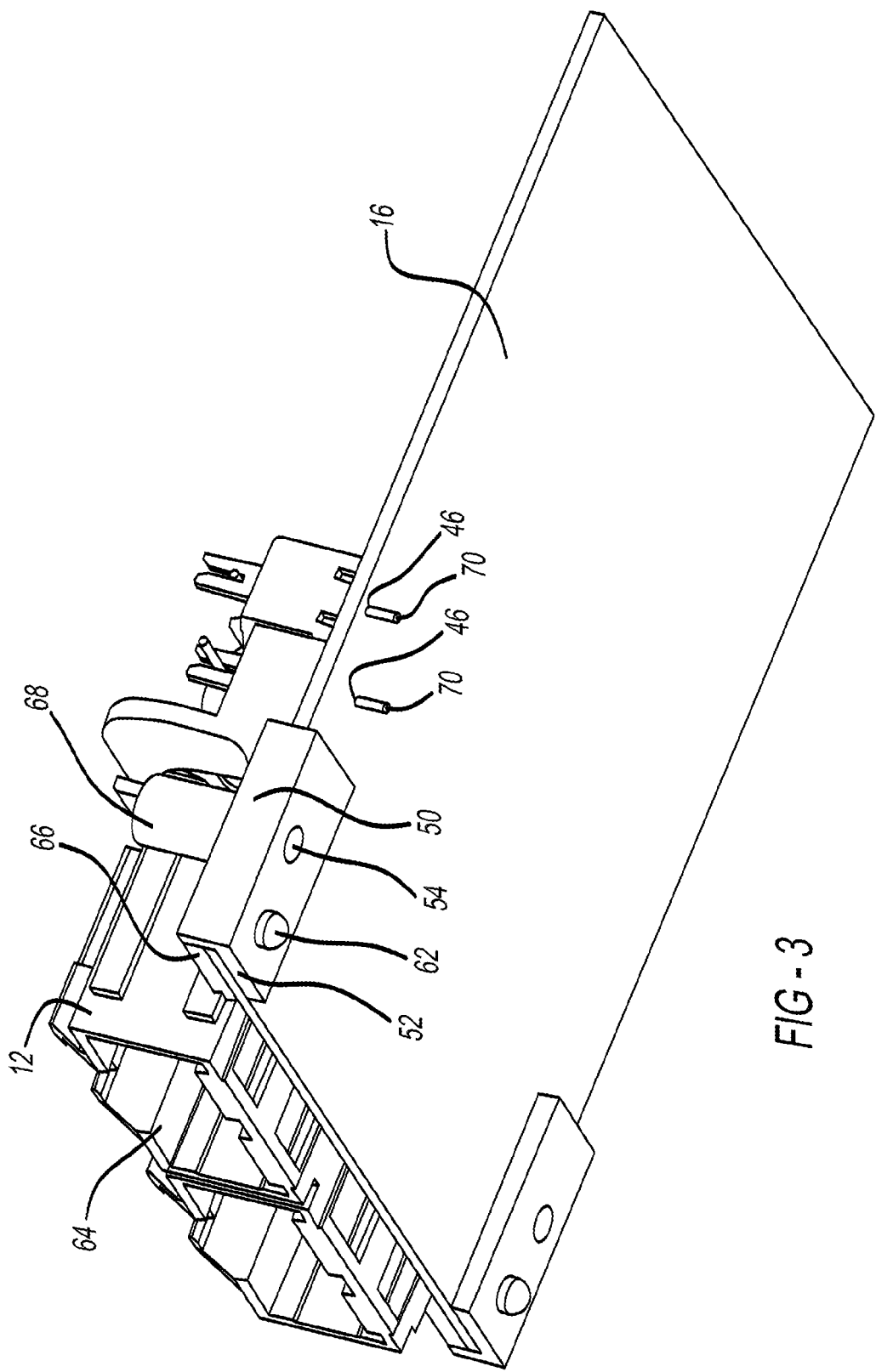
FIG. 3 shows the assembly of FIG. 1 in a second perspective view.

FIG. 3 shows the assembly 10 of FIG. 2 from below. The assembly 10 of FIGS. 2 and 3 shows the guide pins 62 arranged on lateral wings 66 of the port connector 12. As evident from FIG. 3, the guide pins 62 extend through the circuit board 16 and the flange plates 52. In FIGS. 2 and 3, fastener nuts 68 are shown extending upward from the fastening holes 54. The fastener nuts 68 may be formed in the molding process together with the frame 22. Alternatively, the fastener nuts 68 may be separate parts. For ease of assembly, the fastener nuts 68 may be affixed to the frame 22.

Further shown in FIG. 3 are pins 70 of the contact tongues 42 extending through the corresponding holes 46 in the circuit board 16. In the alternative embodiment of FIG. 5, the capacitor contact leads 36 instead of the pins 70 extend through the holes 46 in the circuit board 16.

Figure 4:
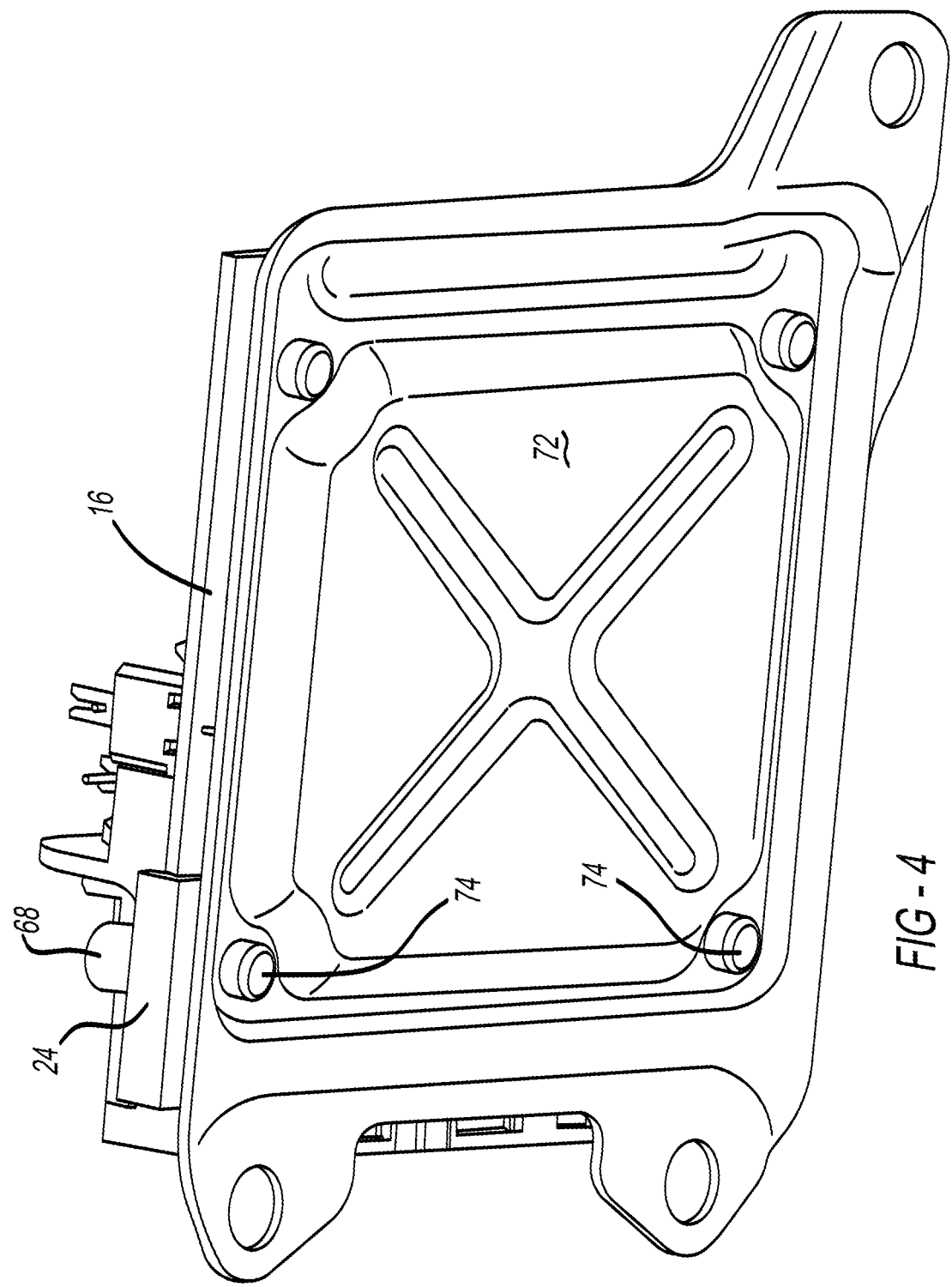
FIG. 4 shows the assembly of FIG. 1 in a similar perspective as FIG. 3, but mounted on a backing plate.

In FIG. 4, the assembly 10 is mounted on a backing plate 72. On each lateral side of the circuit board 16, a fastener, such as a threaded bolt 74, extends from the underside of the backing plate 72 through the fastening hole 54 in the flange plate 52, through the mounting hole 56 in the circuit board 16, and through the top portion 48 of the flange arm, and is secured in the fastener nut 68. Thus, the frame 22 does not require additional fasteners than those that are already used to secure the circuit board 16 to the backing plate 72.

Alternatively, the guide pin 62 of the connector 64 may be hollow with an inner thread so that the threaded bolt 74 may be anchored inside the hollow guide pin, thereby sandwiching the backing plate 72, the frame 22, the circuit board 16, and the connector 62 via one common fastener. Such a design allows to select the axis of the threaded bolt 74 as a common datum axis for the connector 64, the crossbar 26, the capacitor cradle 32, the circuit board 16, and the backing plate 72. This single datum axis reduces the components' dimensional variability and improves the assembly process.

By affixing many of these components directly via the threaded bolt 74, vibrational energy of the components can dissipate directly through the threaded bolt while minimizing a transmission of the vibrations through the adjacent components.

While the above description constitutes the preferred embodiments of the present invention, it will be appreciated that the invention is susceptible to modification, variation and change without departing from the proper scope and fair meaning of the accompanying claims.

What is claimed is:

1. An assembly for mounting a port connector and a cylindrical capacitor on a circuit board, the assembly comprising:
    the circuit board defining a circuit board plane; and a monolithic plastic frame having a flange with a fastening structure via which the frame is mounted on the circuit board;
    wherein the fastening structure is a fastener hole;
    a snap structure for a snap-in attachment of the port connector to the frame near an end edge of the circuit board, a capacitor cradle for holding the cylindrical capacitor adjacent to the snap structure; and a socket section bearing socket contacts for receiving capacitor contact leads of the capacitor; wherein the flange includes two flange arms adjacent opposite lateral edges of the circuit board and each of the two flange arms includes a top portion and lateral flange rail for laterally positioning the circuit board between the flange rails;
    each of the two flange arms include a flange plate adjoining the flange rail, the flange plate vertically positioning the circuit board and extending on a side of the circuit board that is opposite the snap structure.

2. The assembly of claim 1, wherein the capacitor cradle is elevated from the circuit board plane, defining an air gap between the capacitor cradle and the circuit board.

3. The assembly of claim 2, wherein the capacitor cradle is formed on a crossbar extending parallel to the end edge.

4. The assembly of claim 1, wherein the capacitor cradle is shaped to hold the cylindrical capacitor in a direction, in which the cylindrical axis extends parallel to the end edge of the circuit board.

5. The assembly of claim 1, wherein the snap structure is formed on a crossbar extending parallel to the end edge between the capacitor cradle and the end edge.

6. The assembly of claim 1, wherein the socket contacts are external socket contacts.

7. The assembly of claim 6, wherein the external socket contacts are slotted tongues.

8. The assembly of claim 1, wherein the socket contacts are disposed inside socket channels for receiving the capacitor contact leads.

9. The assembly of claim 1, wherein each of the flange arms has a guide structure for positioning the port connector.

10. The assembly of claim 1, wherein the fastener hole extends perpendicular to the circuit board plane through the top portion and through the flange plate of each flange arm.

11. The assembly of claim 1, further comprising the port connector, wherein the port connector has a snap counter-structure engaging the snap structure of the frame.

12. The assembly of claim 11, wherein the port connector includes guide elements engaging a guide structure on the frame.

13. The assembly of claim 1, further comprising the cylindrical capacitor with the capacitor contact leads, the capacitor being elastically held in the cradle and the capacitor contact leads being held in the socket contacts.

14. The assembly of claim 13, wherein the capacitor is an electrolytic capacitor.

\* \* \* \* \*